US012794508B2

(12) United States Patent
Karman et al.

(10) Patent No.: US 12,794,508 B2
(45) Date of Patent: Nov. 10, 2026

(54) SIGNAL GENERATION IN AND/OR FOR RADIO

(71) Applicant: Infineon Technologies Americas Corp., El Segundo, CA (US)

(72) Inventors: Saleh Karman, Villach (AT); Giacomo Castoro, Trapani (IT); Michele Rossoni, Bergamo (IT); Simone Mattia Dartizio, Milan (IT)

(73) Assignee: Infineon Technologies Americas Corp., El Segundo, CA (US)

( * ) Notice: Subject to any disclaimer, the term of this patent is extended or adjusted under 35 U.S.C. 154(b) by 127 days.

(21) Appl. No.: 18/905,972

(22) Filed: Oct. 3, 2024

(65) Prior Publication Data

US 2026/0100730 A1 Apr. 9, 2026

(51) Int. Cl.

| | |
|---|---|
| ***H04B 1/44*** | (2006.01) |
| ***H03K 3/037*** | (2006.01) |
| ***H03K 21/02*** | (2006.01) |
| ***H03M 1/82*** | (2006.01) |

(52) U.S. Cl.

CPC ............... *H04B 1/44* (2013.01); *H03K 3/037* (2013.01); *H03K 21/02* (2013.01); *H03M 1/82* (2013.01)

(58) Field of Classification Search

CPC ........ H03K 5/1565; H03K 5/135; H03K 5/14; H03K 5/133; H03K 2217/960725; H03K 2217/96074; H03K 5/13; H03K 5/131; H03K 3/0231; H03K 17/962; H03K 2005/00019; H03K 2017/9613; H03K 2217/960745; H03K 2005/00026

USPC ............................................................. 455/78

See application file for complete search history.

(56) References Cited

U.S. PATENT DOCUMENTS

| | | | | |
|---|---|---|---|---|
| 11,569,831 | B1 | 1/2023 | Grimaldi et al. | |
| 2016/0344401 | A1 * | 11/2016 | La Grou | H03M 1/1038 |
| 2022/0308836 | A1 * | 9/2022 | Corron | G06F 7/588 |
| 2025/0141351 | A1 * | 5/2025 | Halberstadt | H02M 1/0009 |
| 2026/0099169 | A1 * | 4/2026 | Kong | G06F 1/12 |

OTHER PUBLICATIONS

Simone M. Dartizio, et al, "A Low-Spur and Low-Jitter Fractional-N Digital PLL Based no an Inverse-Constant-Slope DTC and FCW Subtractive Dithering", IEE Journal of Solid-State Circuits, vol. 58, No. 12, Dec. 2023; 18 pages.

* cited by examiner

*Primary Examiner* — Ajibola A Akinyemi

(57) ABSTRACT

A method includes generating an output clock in a digitally controlled oscillator, dividing the output clock to generate a divided clock, generating a feedback clock based on the divided clock, generating an error signal based on a phase difference between a reference clock and the feedback clock, and controlling the digitally controlled oscillator based on the error signal, wherein generating the feedback clock includes connecting a first current source to a capacitor according to a fixed delay with respect to the divided clock, connecting a second current source to the capacitor prior to the fixed delay according to a first programmable select parameter, connecting a third current source to the capacitor prior to the fixed delay according to a second programmable select parameter, and generating the feedback clock based on a voltage of the capacitor after connecting the first, second, and third current sources to the capacitor.

20 Claims, 9 Drawing Sheets

SIGNAL GENERATION IN AND/OR FOR RADIO

TECHNICAL FIELD

The present disclosure relates to the field of communications, and more particularly to signal generation in and/or for a radio.

BACKGROUND

Low power networked devices, such as Internet of Things (IoT) devices require energy efficiency. The vast networks of battery-operated low-power IoT devices are constrained by their battery usage. Application fields such as home automation require IoT devices that operate in random-sparse event modes, which result in high power consumption due to idle listening time of a transceiver.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment, a method comprises generating an output clock signal in a digitally controlled oscillator, dividing the output clock signal to generate a divided clock signal, generating a feedback clock signal based on the divided clock signal, generating a phase error signal based on a phase difference between a reference clock signal and the feedback clock signal, and controlling the digitally controlled oscillator based on the phase error signal, wherein generating the feedback clock signal comprises connecting a first current source to a capacitor according to a fixed delay with respect to the divided clock signal, connecting a second current source to the capacitor prior to the fixed delay according to a first programmable select parameter, connecting a third current source to the capacitor prior to the fixed delay according to a second programmable select parameter, and generating the feedback clock signal based on a voltage of the capacitor after connecting the first current source, the second current source, and the third current source to the capacitor.

In an embodiment, a system comprises means for generating an output clock signal in a digitally controlled oscillator, means for dividing the output clock signal to generate a divided clock signal, means for generating a feedback clock signal based on the divided clock signal, means for generating a phase error signal based on a phase difference between a reference clock signal and the feedback clock signal, and means for controlling the digitally controlled oscillator based on the phase error signal, wherein the means for generating the feedback clock signal comprises means for connecting a first current source to a capacitor according to a fixed delay with respect to the divided clock signal, means for connecting a second current source to the capacitor prior to the fixed delay according to a first programmable select parameter, means for connecting a third current source to the capacitor prior to the fixed delay according to a second programmable select parameter, and means for generating the feedback clock signal based on a voltage of the capacitor after connecting the first current source, the second current source, and the third current source to the capacitor.

In an embodiment, a frequency synthesizer comprises a digitally controlled oscillator configured to generate an output clock signal based on a digital control word, a clock divider configured to divide the output clock signal to generate a divided clock signal, a digital-to-time converter configured to generate a feedback clock signal based on the divided clock signal, a time-to-digital converter configured to generate a phase error signal based on a bias control word and a phase difference between a reference clock signal and the feedback clock signal, and a loop filter configured to generate the digital control word based on the phase error signal, wherein the digital-to-time converter comprises a delay circuit, comprising a capacitor, a first current source, a second current source, a third current source, and a buffer configured to generate the feedback clock signal based on a voltage of the capacitor, and a precharge generator configured to generate a first timing signal for connecting the first current source to the capacitor according to a fixed delay with respect to the divided clock signal, generate a second timing signal for connecting the second current source to the capacitor according to a first programmable select parameter, and generate a third timing signal for connecting the third current source to the capacitor according to a second programmable select parameter.

In an embodiment, a radio comprises an antenna port, a transmit-receive switch connected to the antenna port, a receive path connected to the transmit-receive switch, a transmit path connected to the transmit-receive switch, and a processor configured to connect the receive path to the transmit-receive switch in a receive mode of the radio and connect the transmit path to the transmit-receive switch in a transmit mode of the radio, wherein the transmit path comprises a frequency synthesizer configured to generate an output clock signal, a local oscillator generator configured to generate a local oscillator signal based on the output clock signal, and a power amplifier connected to the transmit-receive switch and configured to amplify the local oscillator signal to generate a transmit signal, the frequency synthesizer comprises a digitally controlled oscillator configured to generate the output clock signal based on a digital control word, a clock divider configured to divide the output clock signal to generate a divided clock signal, a digital-to-time converter configured to generate a feedback clock signal based on the divided clock signal, a time-to-digital converter configured to generate a phase error signal based on a bias control word and a phase difference between a reference clock signal and the feedback clock signal, and a loop filter connected to the time-to-digital converter and configured to generate the digital control word based on the phase error signal, wherein the digital-to-time converter comprises a delay circuit, comprising a capacitor, a first current source, a second current source, a third current source, and a buffer configured to generate the feedback clock signal based on a voltage of the capacitor, and a precharge generator configured to generate a first timing signal for connecting the first current source to the capacitor according to a fixed delay with respect to the divided clock signal, generate a second timing signal for connecting the second current source to the capacitor according to a first programmable select parameter, and generate a third timing signal for connecting the third current source to the capacitor according to a second programmable select parameter.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
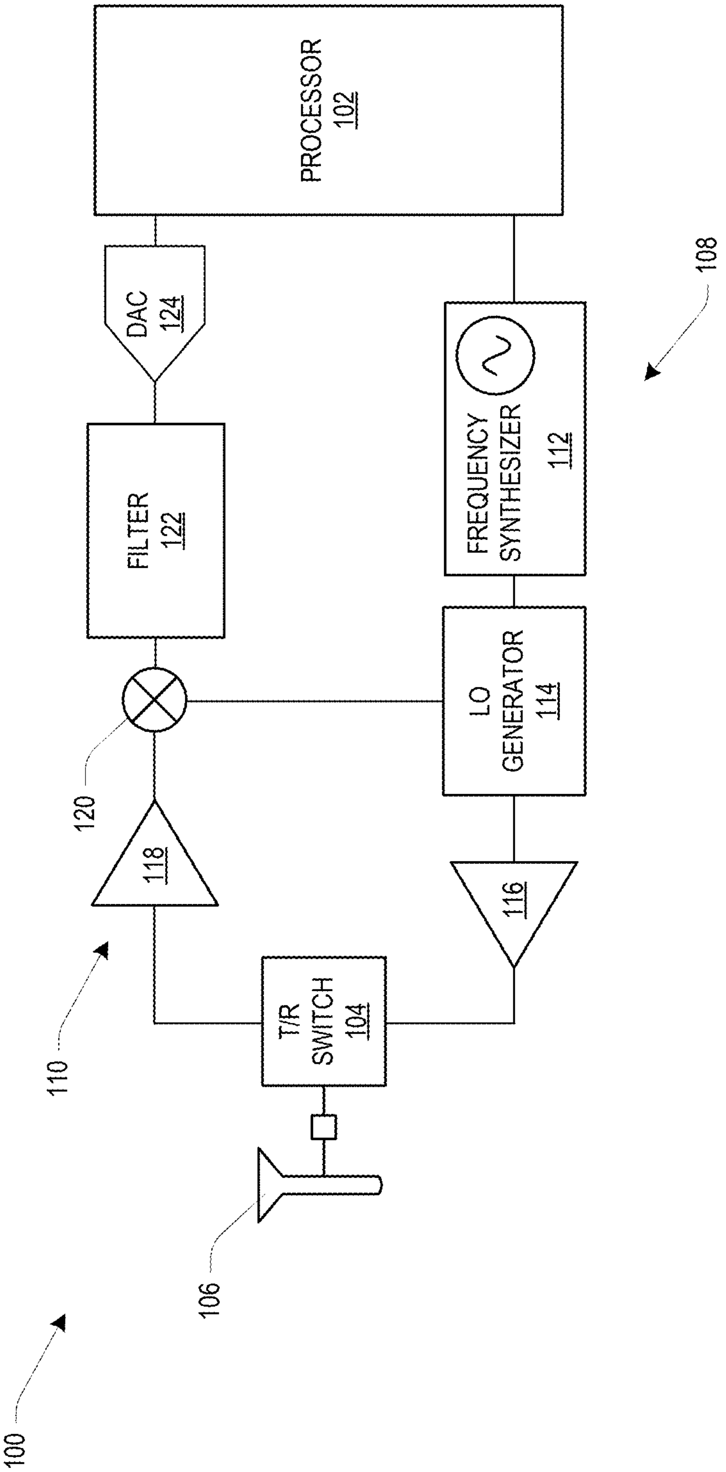
FIG. 1 is a diagram of a radio, according to some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

FIG. 1 is a simplified block diagram of a radio 100, according to some embodiments. The radio 100 may support one or more communication protocols, such as a Bluetooth (BT), Bluetooth Low Energy (BLE), Wi-Fi, or some other communication protocol. According to some embodiments, the radio comprises a processor 102, such as a digital base band processor, and a transmit-receive (T-R) switch 104 configured to selectively connect an antenna 106 to a transmit path 108 or a receive path 110. In some embodiments, the transmit path 108 comprises a frequency synthesizer 112 configured to generate an output clock signal, a local oscillator (LO) generator 114 configured to generate an LO signal based on the output clock signal, and a power amplifier 116 connected to the T-R switch 104 and configured to amplify the LO signal to generate a transmit signal. In some embodiments, the receive path 110 comprises a low noise amplifier 118 for amplifying a receive signal a mixer 120 for mixing the receive signal and the LO signal, a filter 122, such as baseband filter or an intermediate frequency filter (depending on the radio architecture), for demodulating the receive signal, and the digital-to-analog converter (DAC) 124 for digitizing the receive signal.

The processor 102 implements a software or firmware application that controls communication by the radio 100. The processor 102 includes one or multiple processors, microprocessors, data processors, co-processors, application specific integrated circuits (ASICs), controllers, programmable logic devices, chipsets, field-programmable gate arrays (FPGAs), application specific instruction-set processors (ASIPs), system-on-chips (SoCs), central processing units (CPUs) (e.g., one or multiple cores), microcontrollers, and/or some other type of component that interprets and/or executes instructions and/or data. The processor 102 may be implemented as hardware (e.g., a microprocessor, etc.) or a combination of hardware and software (e.g., a SoC, an ASIC, etc.) and may include one or multiple memories (e.g., cache, random access memory (RAM), dynamic random access memory (DRAM), cache, read only memory (ROM), a programmable read only memory (PROM), a static random access memory (SRAM), a single in-line memory module (SIMM), a dual in-line memory module (DIMM), a flash memory, and/or some other suitable type of memory).

The processor 102 controls the T-R switch 104 to toggle between transmit and receive modes such that the transmit path 108 is connected to the antenna 106 during a transmit mode and the receive path 110 is connected to the antenna 106 during a receive mode. The radio 100 may include fewer components, additional components, different components, and/or a different arrangement of components than those illustrated in FIG. 1.

Figure 2:
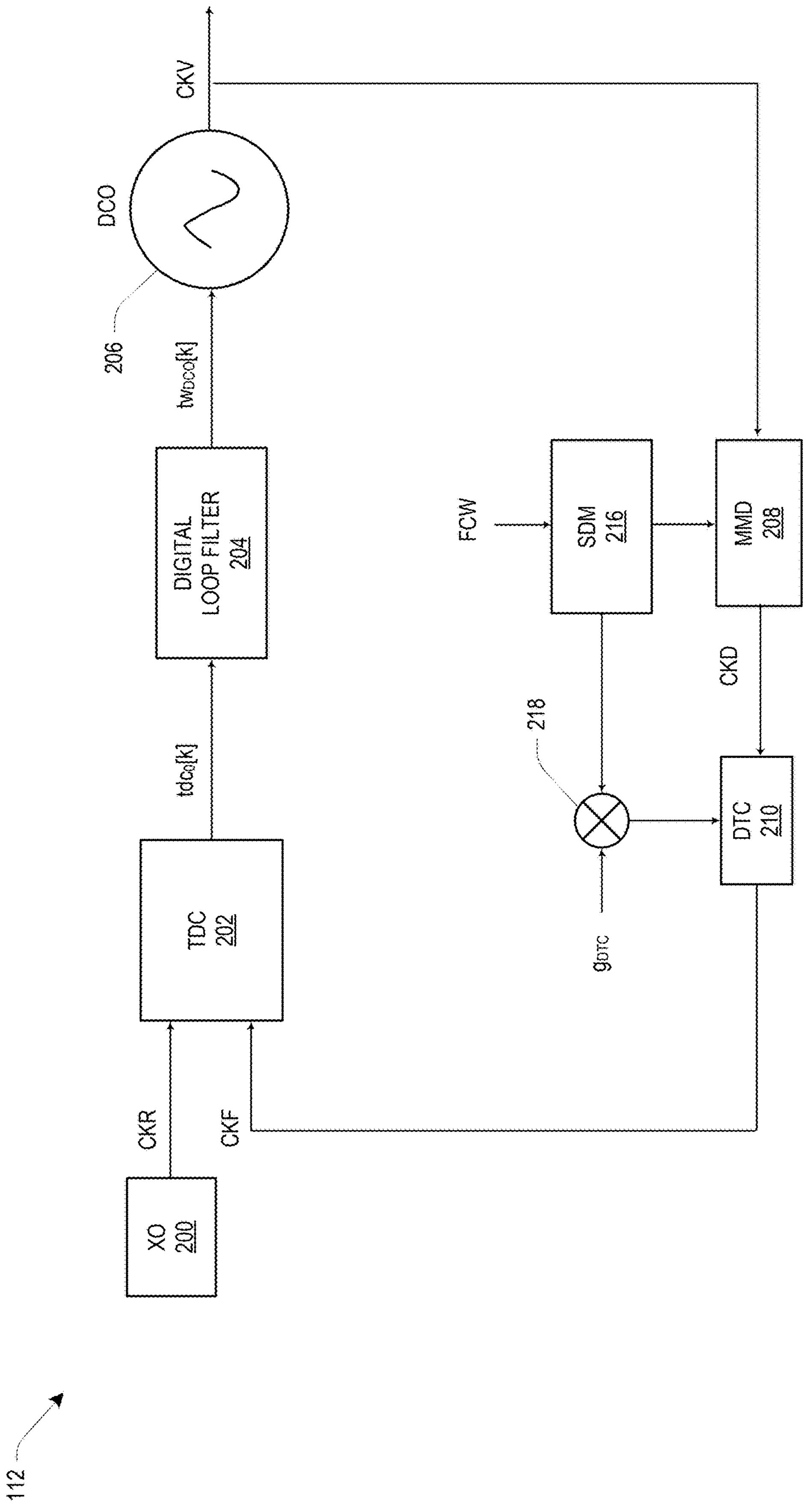
FIG. 2 is a diagram illustrating a frequency synthesizer, according to some embodiments.

FIG. 2 is a simplified block diagram of the frequency synthesizer 112, according to some embodiments. In some embodiments, the frequency synthesizer 112 is employs a digital phase locked loop (DPLL) topology. The frequency synthesizer 112 comprises a crystal oscillator (XO) 200 configured to generate an analog reference clock signal (CKR), a time-to-digital converter (TDC) 202 configured to generate a phase error signal ($tdc_0[k]$) based on a phase difference between the reference clock signal (CKR) and a feedback clock signal (CKF), a digital loop filter 204 configured to filter the phase error signal, $tdc_0[k]$, to generate a control signal ($tw_{DCO}[k]$), and a digitally controlled oscillator 206 to generate an output clock signal (CKV) based on the control signal ($tw_{DCO}[k]$). In some embodiments, the feedback clock signal (CKF) is generated by a multi-modulus divider (MMD) 208 configured to divide the output clock signal (CKV) to generate a divided clock signal (CKD) and a digital-to-time converter (DTC) 210 configured to cancel quantization noise generated in the MMD 208 and generate the analog feedback clock signal (CKF).

In some embodiments, a frequency control word (FCW) is provided to a sigma-delta modulator (SDM) 216. Multiplying the FCW by the frequency of the reference clock signal (CKR) defines the target frequency of the frequency synthesizer 112. An output of the SDM 216 is provided to the MMD 208 and a factor representing accumulated quantization error of the SDM 216 is scaled by a gain factor ($g_{DTC}$) in a multiplication unit 218 and provided to the DTC 210.

Figure 3:
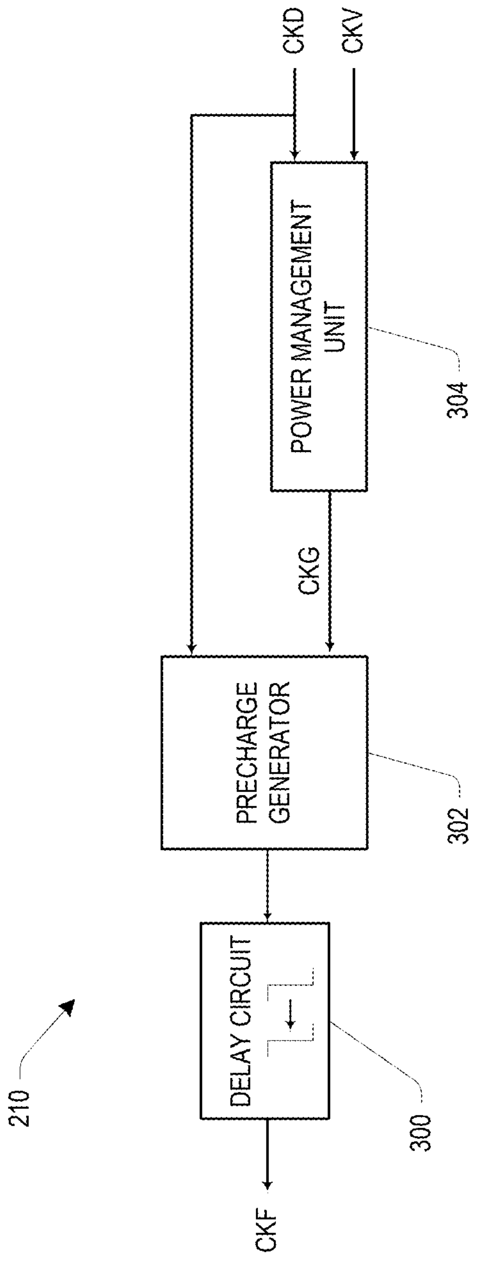
FIGS. 3 and 4 are diagrams of a digital-to-time converter (DTC), according to some embodiments.

FIG. 3 is block diagram of the DTC 210, according to some embodiments. In some embodiments, the DTC 210 comprises a delay circuit 300 configured to generate the feedback clock signal (CKF), a precharge generator 302 configured to generate timing signals for the delay circuit 300 based on the output clock signal (CKV) and the divided clock signal (CKD), and a power management unit 304 configured to generate a gated clock signal (CKG) for the precharge generator 302 to conserve power. In some embodiments, the delay circuit 300 implements an inverse constant-slope (ICS) topology.

Figure 4:
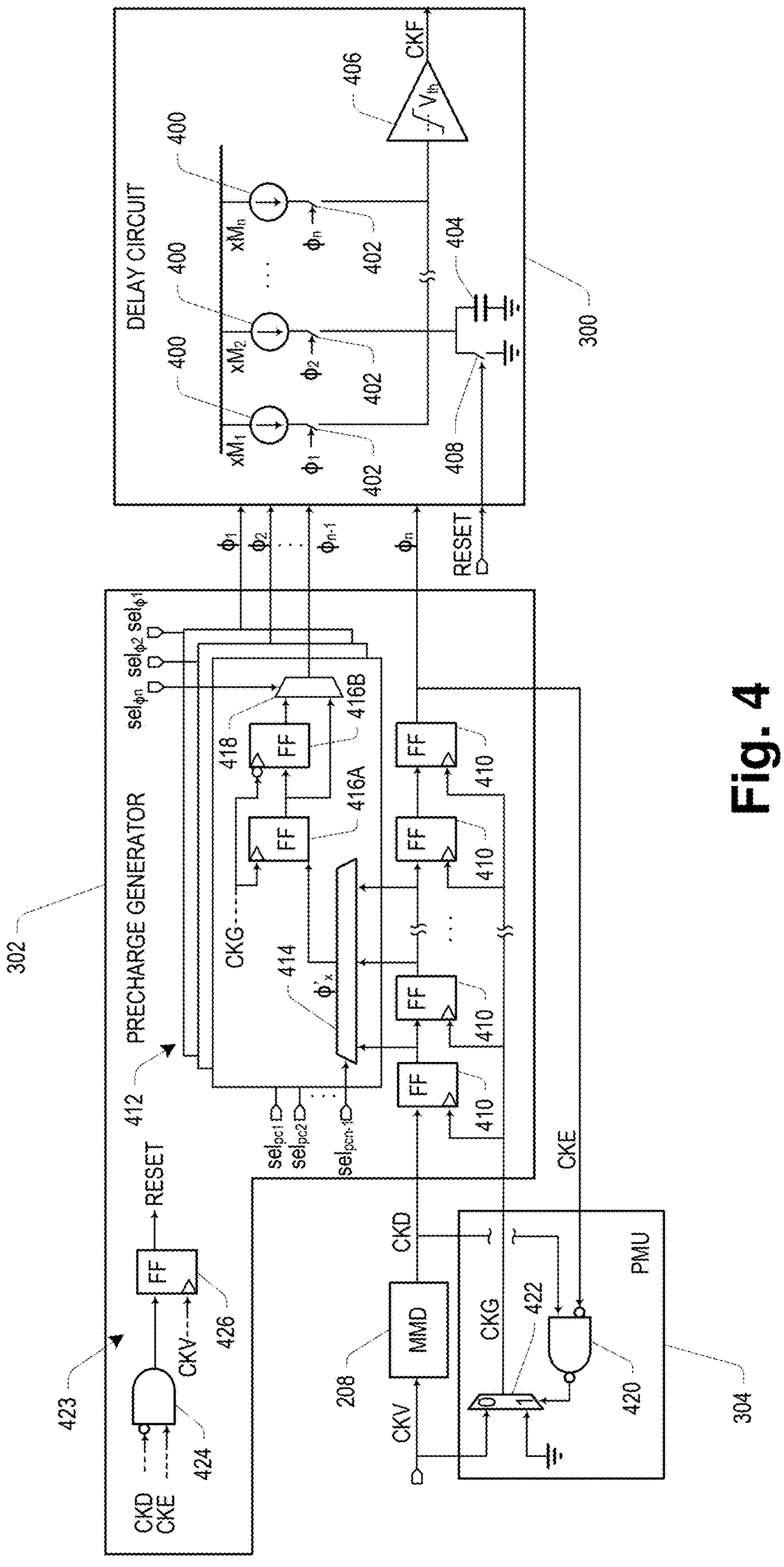

FIG. 4 is a detailed block diagram of the DTC 210, according to some embodiments. In some embodiments, the delay circuit 300 comprises n current sources 400 ($xM_1 \ldots xM_n$) connected by switches 402 to charge a capacitor 404, a buffer 406 to generate the feedback clock signal (CKF) responsive to a voltage on the capacitor 404 meeting a threshold ($V_{th}$), and a switch 408 configured to discharge the capacitor 404 to ground responsive to a RESET signal from the precharge generator 302.

In some embodiments, the precharge generator 302 generates timing signals, ($\phi_1 \ldots \phi_n$) for controlling the switches 402 to set a programmable delay between the divided clock signal (CKD) and the feedback clock signal (CKF). The timing signals, ($\phi_1 \ldots \phi_n$) control the charging rate of the capacitor 404 by sequentially connecting the current sources 400 by the switches 402. As additional current sources 400 are connected to the capacitor 404, the charging rate increases. By controlling the timing at which the current sources 400 are connected to the capacitor 404, the precise time required to charge the capacitor 404 to meet the threshold ($V_{th}$) and generate the feedback clock signal (CKF) can be controlled.

In some embodiments, the precharge generator 302 generates the timing signals, ($\phi_1 \ldots \phi_n$) for controlling the delay circuit 300. The precharge generator 302 comprises a series set of m flip flops 410 that sample the CKD signal and generate the timing signal $\phi_n$ after a fixed delay at $mT_{dco}$. The precharge generator 302 comprises n−1 timing signal stages 412 each configurable by a precharge select parameter ($sel_{pc1} \ldots sel_{pcn-1}$). Hence the first timing signal stage 412 generates $\phi_1$ and the last timing signal stage 412 generates $\phi_{n-1}$. Each timing signal stage 412 comprises a multiplexer 414 configured to generate an intermediate stage timing signal $\phi'_x$ for an $x^{th}$ timing signal stage 412 which anticipates $\phi_n$ by selecting one of the m flip-flops 410 based on the precharge select parameter ($sel_{pcx}$), hence $$\phi_n - \phi_x' = \mathrm{sel}_{pcx} \cdot T_{dco}.$$

In some embodiments, flip flops 416A, 416B sample positive and negative edges of the $\phi_x$' signal, respectively. A multiplexer 418 is configurable by an edge select parameter ($sel_{\phi x}$) to determine which edge is used to generate the timing signal ox, thereby doubling the resolution of the DTC 210 according to $$\phi_n - \phi_x' = \mathrm{sel}_{pcx} \cdot T_{dco}/2,$$

where $T_{dco}$ is the time period of the CKV signal generated by the DCO 206.

Figure 5A:
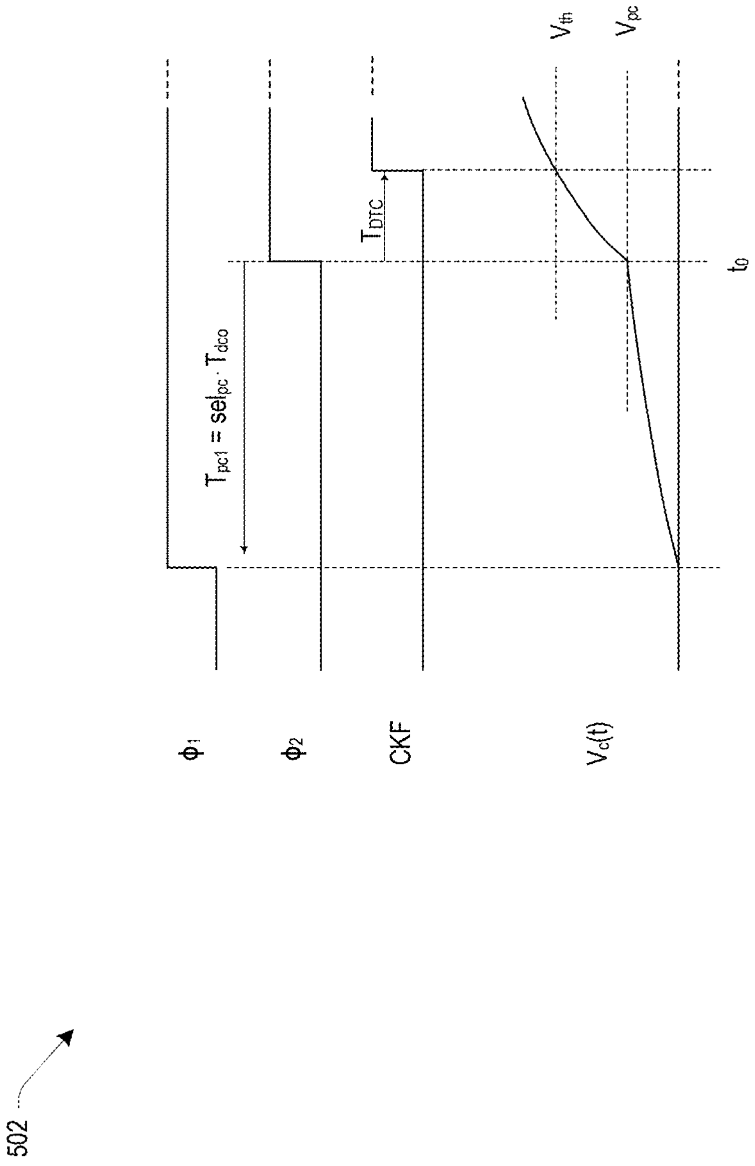
FIGS. 5A, 5B, and 5C are timing diagrams illustrating operation of a DTC, according to some embodiments.
Figure 5B:
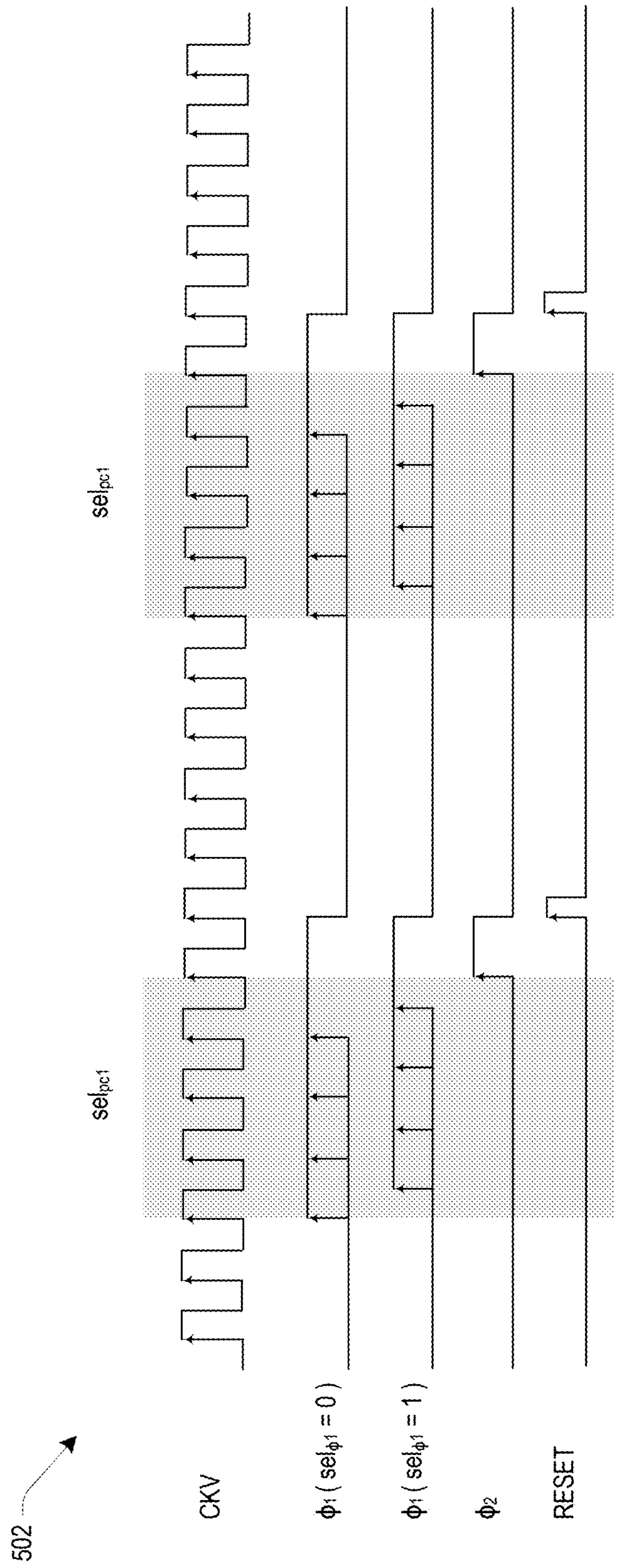

FIGS. 5A and 5B are timing diagrams 500, 502 illustrating operation of the DTC 210 in a simplified example using two current sources 400, according to some embodiments. Two current generators, $I_1$ and $I_2$, having currents in a ratio of $M_2$:$M_1$, are connected to charge the capacitor 404 by closing the switches 402 responsive to the timing signals $\phi_1$ and $\phi_2$. When the voltage on the capacitor 404 $V_c(t)$ crosses the threshold $V_{th}$ of the buffer 406, CKF is triggered. Controlling the timing at which the first and second switches 402 close determines the DTC delay ($T_{dtc}$) measured as the time between the toggling of the last timing signal $\phi_2$ at $t_0$ and the time at which the threshold $V_{th}$ of the buffer is crossed by $v_c(t)$. The time by which $\phi_1$ anticipates $\phi_2$ is $T_{pc}$ is programmable by the parameters $sel_{pc1}$ and $sel_{\phi 1}$ according to the expression $T_{pc1}=sel_{pc1} \cdot T_{dco}$ if $sel_{\phi 1}=0$, and $T_{pc1}=sel_{pc1} \cdot T_{dco}+T_{dco}/2$ if $sel\phi 1=1$. The voltage $v_c(t)$ at time $t_0$ depends on the selected $T_{pc}$: a longer $T_{pc}$ results in a higher starting voltage at the time the second switch is closed, since $I_1$ had more time available to load the capacitor 404. At $t_0$, the second (last) switch 402 is closed and the capacitor 404 continues to be charged towards VDD by the sum of $I_1$ and $I_2$ currents.

To illustrate the intrinsic linearity of the delay circuit 300, consider the load capacitance and its characteristic equation:

$$dt = \frac{C(V)}{I(V)} \cdot dV, \tag{1}$$

where the explicit dependency of the capacitance and current at the output node are highlighted (e.g. due to drain modulation and other nonlinear effects). Considering the first integration period where $I_1$ is active, Equation 1 becomes:

$$T_{pc} = \int_0^{V_{pc}} \frac{C(V)}{I_1(V)} \cdot dV = \frac{1}{M_1} \int_0^{V_{pc}} \frac{C(V)}{I(V)} \cdot dV. \tag{2}$$

Considering the second integration period where both $I_1$ and $I_2$ are enabled:

$$T_{dtc} = \int_{V_{pc}}^{V_{th}} \frac{C(V)}{I_1(V)+I_2(V)} \cdot dV = \frac{1}{M_1+M_2} \cdot \int_{V_{pc}}^{V_{th}} \frac{C(V)}{I(V)} \cdot dV, \tag{3}$$

it follows that:

$$T_{dtc} = \frac{1}{M_1+M_2} \cdot \int_0^{V_{th}} \frac{C(V)}{I(V)} \cdot dV - \frac{M_1}{M_1+M_2} \cdot T_{pc}. \tag{4}$$

The delay of the DTC 210 has a linear dependence on $T_{PC}$ with a slope $M_1/(M_1+M_2)$. The effects of channel length modulation and other non-linear capacitor effects are included in the first integral, which is a constant since the integration bounds are fixed, hence, they do not impact the linearity of the DTC 210.

Expanding this example to n stages, the propagation delay can be described by:

$$T_{dtc} = \frac{M_1}{\sum_{i=1}^{n} M_i} \cdot \left( \int_0^{V_{th}} \frac{C(V)}{I(V)} \cdot dV - \sum_{i=1}^{n-1} T_{pc,i} \cdot M_i \right). \tag{5}$$

The achievable time resolution of the DTC 210 is:

$$LSB_{dtc} = LSB_{pc} \frac{M_1}{\sum_{i=1}^{n} M_i},$$

where the value of $LSB_{dtc}$ decreases with an increasing value of n.

To provide a continuous characteristic of the segmented delay circuit 300, the ratio between two adjacent current sources 400 is equal to the number of timing signal stages 412 in the precharge generator 302:

$$N = \frac{M_i}{M_{i-1}},$$

with the exception of the last current source 400, which is sized according to:

$$M_n = N^n - \sum_{i=1}^{n-1} M_i.$$

Figure 5C:
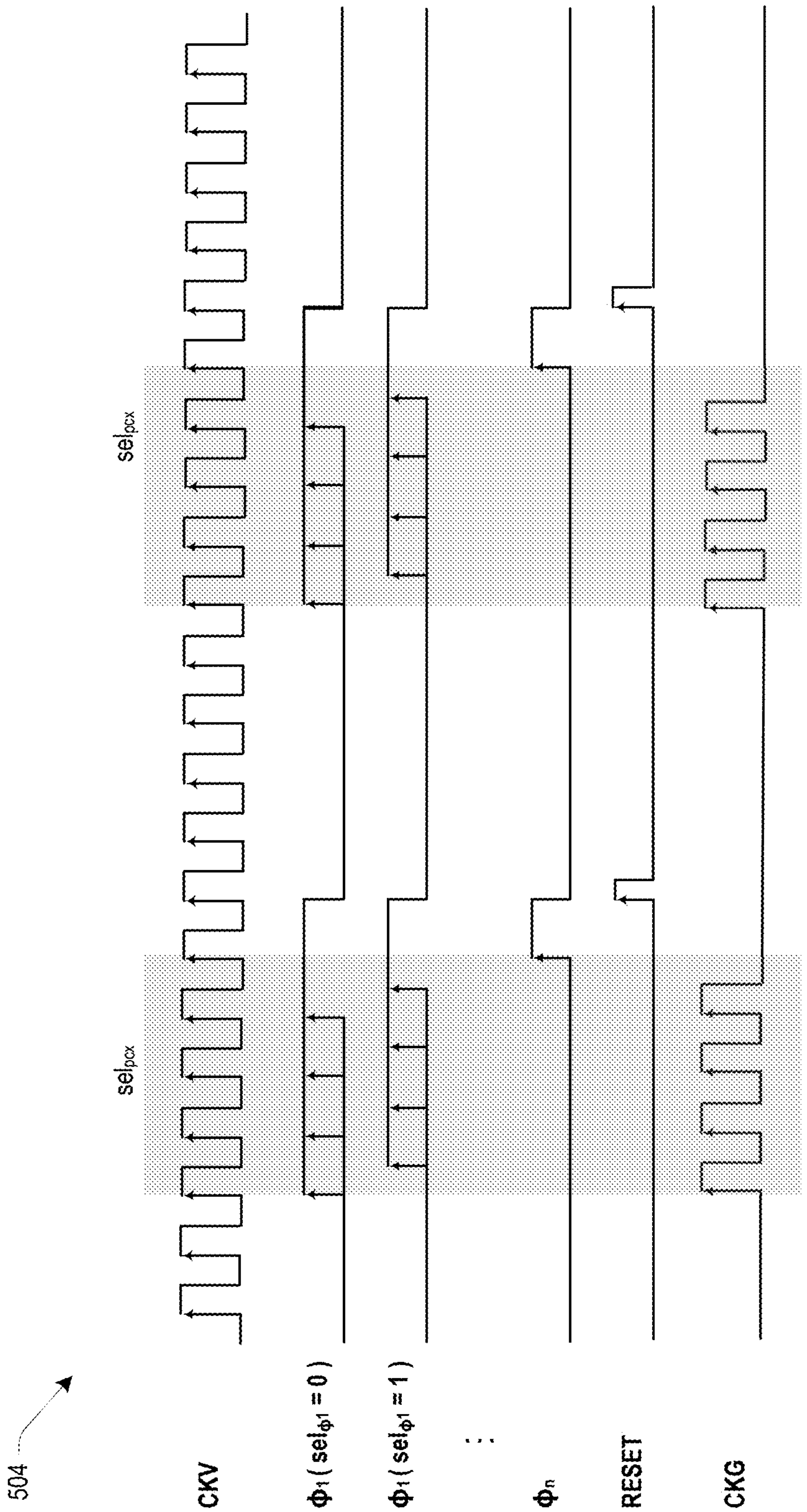

FIG. 5C is a timing diagrams 504 illustrating operation of the DTC 210 using n current sources 400, according to some embodiments. Each timing signal stage 412 is configurable by the precharge select parameter ($sel_{pcx}$) and the edge select parameter ($sel_{\phi x}$) to determine the individual charging contribution of each timing signal stage 412, which are combined to determine the overall delay of the DTC 210.

The flip flops 410 in the precharge generator 302 are clocked at or close to the frequency of the DCO 206, causing a significant power consumption. In some embodiments, for low power applications, the power consumption of the precharge generator 302 may be reduced by the power management unit 304. The power management unit 304 generates a gated clock signal (CKG). A logic gate 420 detects when CKD is high and $\phi_n$ is low to enable the gated clock signal (CKG). Once the rising edge of CKD propagates to $\phi_n$ (i.e., after $mT_{dco}$), the logic gate 420 detects that all the timing signal stages 412 generated outputs and sets CKG to ground by toggling a multiplexer 422. The power management unit 304 can be configured to enable CKG on the rising edge or the falling edge of CKD. In an embodiment where the number of flip flops 410 in each timing signal stage 412 is ~10 and the ratio of CKV to CKD is greater than 100, the power management unit 304 may achieve a power saving of ~90%.

In some embodiments, the RESET signal is generated by reset circuit 423 comprising a logic gate 424 that detects when CKE is high and CKD is low (i.e., the falling edge of CKD) and a flip flop 426 gated by CKV that latches the output of the logic gate 424.

Figure 6:
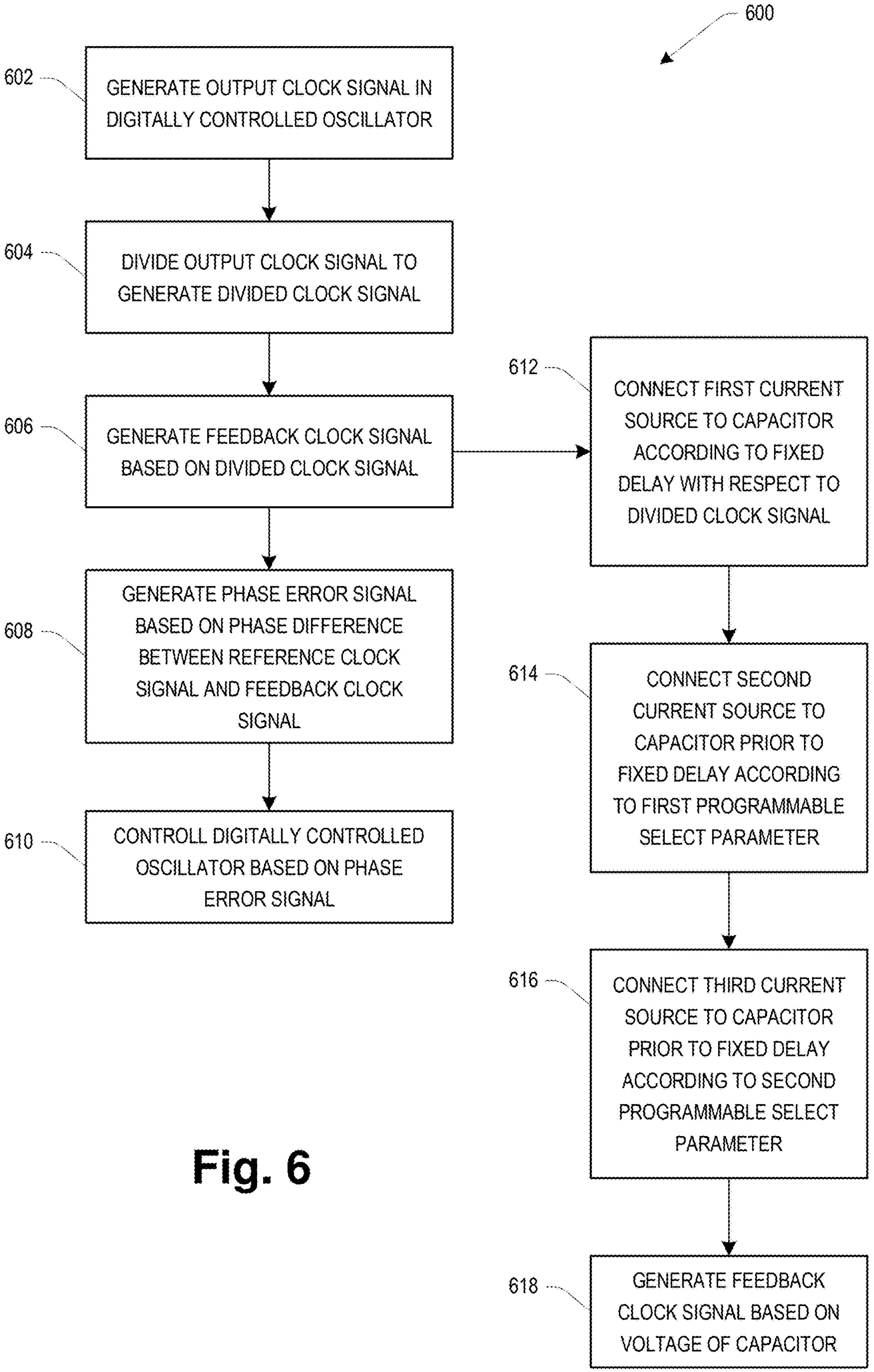
FIG. 6 is a diagram illustrating an example method for generating a timing signal, according to some embodiments.

FIG. 6 is a diagram illustrating an example method 600 for generating a timing signal, according to some embodiments. At 602, an output clock signal is generated in a digitally controlled oscillator 206. At 604, the output clock signal is divided to generate a divided clock signal. At 606, a feedback clock signal is generated based on the divided clock signal. At 608, a phase error signal is generated based on a phase difference between a reference clock signal and the feedback clock signal. At 610, the digitally controlled oscillator 206 is controlled based on the phase error signal. Generating the feedback clock signal at 606 comprises connecting a first current source 400 to a capacitor 404 according to a fixed delay with respect to the divided clock signal at 612. At 614, a second current source 400 is connected to the capacitor 404 prior to the fixed delay according to a first programmable select parameter. At 616, a third current source 400 is connected to the capacitor 404 prior to the fixed delay according to a second programmable select parameter. At 618, the feedback clock signal is generated based on a voltage of the capacitor 404.

Figure 7:
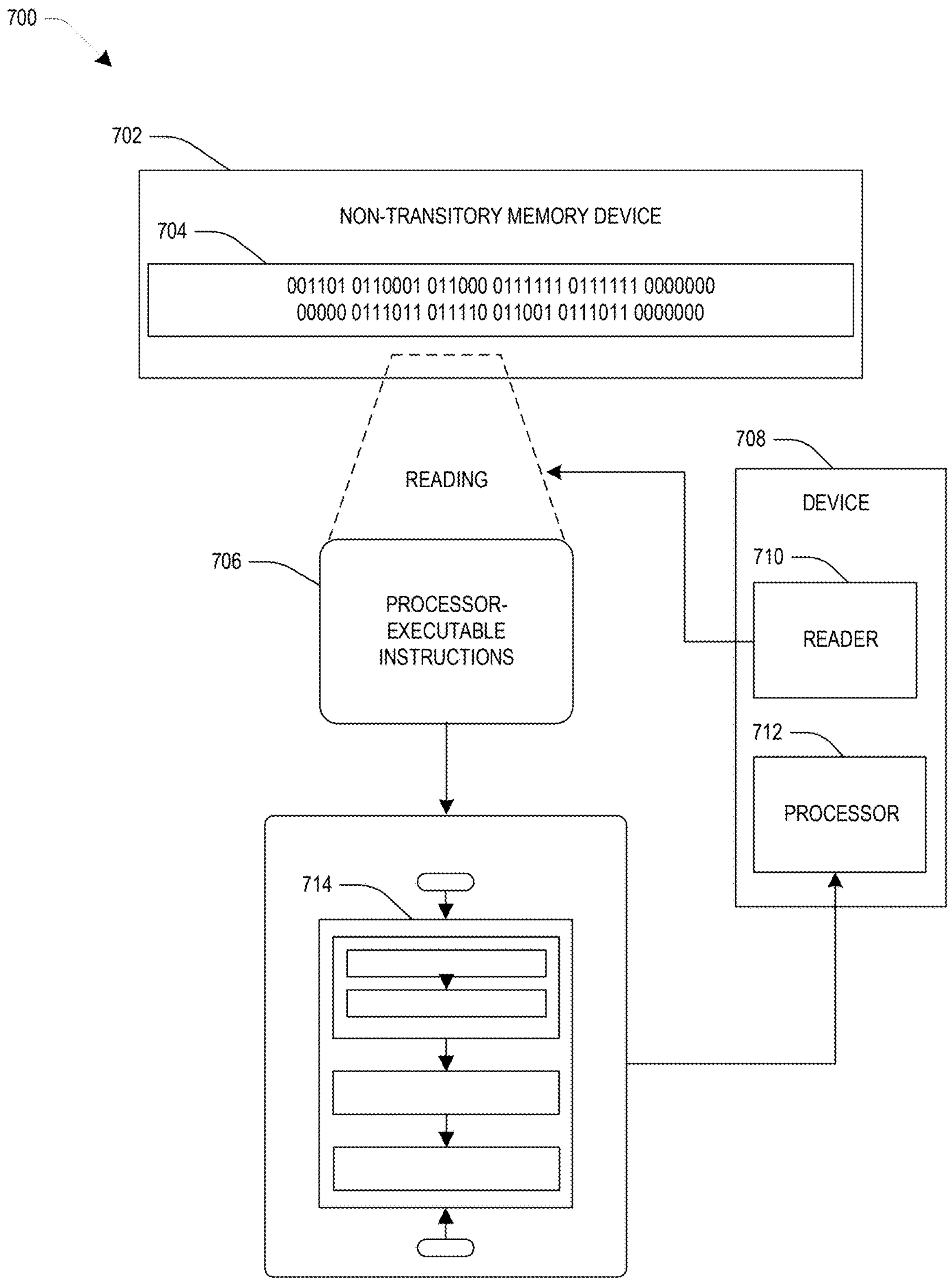
FIG. 7 is a diagram illustrating an example computer-readable medium, according to some embodiments.

FIG. 7 illustrates an exemplary embodiment 700 of a computer-readable medium 702, according to some embodiments. One or more embodiments involve a computer-readable medium comprising processor-executable instructions configured to implement one or more of the techniques presented herein. The embodiment 700 comprises a non-transitory computer-readable medium 702 (e.g., a CD-R, DVD-R, flash drive, a platter of a hard disk drive, etc.), on which is encoded computer-readable data 704. This computer-readable data 704 in turn comprises a set of processor-executable computer instructions 706 that, when executed by a computing device 708 including a reader 710 for reading the processor-executable computer instructions 706 and a processor 712 for executing the processor-executable computer instructions 706, are configured to facilitate operations according to one or more of the principles set forth herein. In some embodiments, the processor-executable computer instructions 706, when executed, are configured to facilitate performance of a method 714, such as at least some of the aforementioned method(s). In some embodiments, the processor-executable computer instructions 706, when executed, are configured to facilitate implementation of a system, such as at least some of the one or more aforementioned system(s). Many such computer-readable media may be devised by those of ordinary skill in the art that are configured to operate in accordance with the techniques presented herein.

The term "computer readable media" may include communication media. Communication media typically embodies computer readable instructions or other data in a "modulated data signal" such as a carrier wafer or other transport mechanism and includes any information delivery media. The term "modulated data signal" may include a signal that has one or more of its characteristics set or changed in such a manner as to encode information in the signal.

In an embodiment, a method comprises generating an output clock signal in a digitally controlled oscillator, dividing the output clock signal to generate a divided clock signal, generating a feedback clock signal based on the divided clock signal, generating a phase error signal based on a phase difference between a reference clock signal and the feedback clock signal, and controlling the digitally controlled oscillator based on the phase error signal, wherein generating the feedback clock signal comprises connecting a first current source to a capacitor according to a fixed delay with respect to the divided clock signal, connecting a second current source to the capacitor prior to the fixed delay according to a first programmable select parameter, connecting a third current source to the capacitor prior to the fixed delay according to a second programmable select parameter, and generating the feedback clock signal based on a voltage of the capacitor after connecting the first current source, the second current source, and the third current source to the capacitor.

In an embodiment, the method comprises providing the divided clock signal to a set of serial flip flops clocked by a first clock signal, and generating a first timing signal for connecting the first current source to the capacitor at an output of a last flip flop in the set of serial flip flops.

In an embodiment, the method comprises suppressing the first clock signal after generating the first timing signal.

In an embodiment, the method comprises generating a second timing signal for connecting the second current source to the capacitor at an output of a first selected one of the flip flops in the set of serial flip flops based on the first programmable select parameter, and generating a third timing signal for connecting the third current source to the capacitor at an output of a second selected one of the flip flops in the set of serial flip flops based on the second programmable select parameter.

In an embodiment, the method comprises configuring a first multiplexer connected to each of the flip flops in the set of serial flip flops based on the first programmable select parameter to connect to the first selected one of the flip flops to generate the second timing signal, and configuring a second multiplexer connected to each of the flip flops in the set of serial flip flops based on the second programmable select parameter to connect to the second selected one of the flip flops to generate the third timing signal.

In an embodiment, the method comprises configuring a first multiplexer connected to each of the flip flops in the set of serial flip flops based on the first programmable select parameter to connect to a first selected one of the flip flops to generate an intermediate timing signal, connecting the first multiplexer to a first flip flop clocked by a rising edge of the output clock signal, connecting the first flip flop to a second flip flop clocked by a falling edge of the output clock signal, and selecting an output of one of the first flip flop or the second flip flop to generate a second timing signal for connecting the second current source to the capacitor.

In an embodiment, the method comprises discharging the capacitor after generating the feedback clock signal.

In an embodiment, a frequency synthesizer comprises a digitally controlled oscillator configured to generate an output clock signal based on a digital control word, a clock divider configured to divide the output clock signal to generate a divided clock signal, a digital-to-time converter configured to generate a feedback clock signal based on the divided clock signal, a time-to-digital converter configured to generate a phase error signal based on a bias control word and a phase difference between a reference clock signal and the feedback clock signal, and a loop filter configured to generate the digital control word based on the phase error signal, wherein the digital-to-time converter comprises a delay circuit, comprising a capacitor, a first current source, a second current source, a third current source, and a buffer configured to generate the feedback clock signal based on a voltage of the capacitor, and a precharge generator configured to generate a first timing signal for connecting the first current source to the capacitor according to a fixed delay with respect to the divided clock signal, generate a second timing signal for connecting the second current source to the capacitor according to a first programmable select parameter, and generate a third timing signal for connecting the third current source to the capacitor according to a second programmable select parameter.

In an embodiment, the precharge generator comprises a set of serial flip flops connected to the divided clock signal and clocked by a first clock signal, and the first timing signal is generated at an output of a last flip flop in the set of serial flip flops.

In an embodiment, the digital-to-time converter comprises a power management unit configured to suppress the first clock signal after the first timing signal is generated.

In an embodiment, the precharge generator comprises a first multiplexer connected to each of the flip flops in the set of serial flip flops and configured based on the first programmable select parameter to connect to a first selected one of the flip flops to generate the second timing signal, and a second multiplexer connected to each of the flip flops in the set of serial flip flops and configured based on the second programmable select parameter to connect to a second selected one of the flip flops to generate the second timing signal.

In an embodiment, the precharge generator comprises a first multiplexer connected to each of the flip flops in the set of serial flip flops and configured based on the first programmable select parameter to connect to a first selected one of the flip flops to generate an intermediate timing signal, a first flip flop connected to the first multiplexer and clocked by a rising edge of the output clock signal, a second flip flop connected to the first flip flop and clocked by a falling edge of the output clock signal, and a second multiplexer connected to the first flip flop and the second flip flop and configured to select an output of one of the first flip flop or the second flip flop to generate the second timing signal for connecting the second current source to the capacitor.

In an embodiment, the digital-to-time converter comprises a switch selectively connecting the capacitor to ground, and a reset circuit configured to generate a reset signal for controlling the switch to discharge the capacitor after generating the feedback clock signal.

In an embodiment, the first current source has a first size, the second current source has the first size, and the third current source has a second size different than the first size.

In an embodiment, a radio comprises an antenna port, a transmit-receive switch connected to the antenna port, a receive path connected to the transmit-receive switch, a transmit path connected to the transmit-receive switch, and a processor configured to connect the receive path to the transmit-receive switch in a receive mode of the radio and connect the transmit path to the transmit-receive switch in a transmit mode of the radio, wherein the transmit path comprises a frequency synthesizer configured to generate an output clock signal, a local oscillator generator configured to generate a local oscillator signal based on the output clock signal, and a power amplifier connected to the transmit-receive switch and configured to amplify the local oscillator signal to generate a transmit signal, the frequency synthesizer comprises a digitally controlled oscillator configured to generate the output clock signal based on a digital control word, a clock divider configured to divide the output clock signal to generate a divided clock signal, a digital-to-time converter configured to generate a feedback clock signal based on the divided clock signal, a time-to-digital converter configured to generate a phase error signal based on a bias control word and a phase difference between a reference clock signal and the feedback clock signal, and a loop filter connected to the time-to-digital converter and configured to generate the digital control word based on the phase error signal, wherein the digital-to-time converter comprises a delay circuit, comprising a capacitor, a first current source, a second current source, a third current source, and a buffer configured to generate the feedback clock signal based on a voltage of the capacitor, and a precharge generator configured to generate a first timing signal for connecting the first current source to the capacitor according to a fixed delay with respect to the divided clock signal, generate a second timing signal for connecting the second current source to the capacitor according to a first programmable select parameter, and generate a third timing signal for connecting the third current source to the capacitor according to a second programmable select parameter.

In an embodiment, the precharge generator comprises a set of serial flip flops connected to the divided clock signal and clocked by a first clock signal, a first multiplexer connected to each of the flip flops in the set of serial flip flops and configured based on the first programmable select parameter to connect to a first selected one of the flip flops to generate the second timing signal, and a second multiplexer connected to each of the flip flops in the set of serial flip flops and configured based on the second programmable select parameter to connect to a second selected one of the flip flops to generate the second timing signal.

In an embodiment, the digital-to-time converter comprises a power management unit configured to suppress the first clock signal after the first timing signal is generated.

In an embodiment, the first timing signal for connecting the first current source to the capacitor is generated at an output of a last flip flop in the set of serial flip flops.

In an embodiment, the digital-to-time converter comprises a switch selectively connecting the capacitor to ground, and a reset circuit configured to generate a reset signal for controlling the switch to discharge the capacitor after generating the feedback clock signal.

In an embodiment, the first current source has a first size, the second current source has the first size, and the third current source has a second size different than the first size.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In an embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" and/or the like is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A method, comprising:

generating an output clock signal in a digitally controlled oscillator;

dividing the output clock signal to generate a divided clock signal;

generating a feedback clock signal based on the divided clock signal;

generating a phase error signal based on a phase difference between a reference clock signal and the feedback clock signal; and controlling the digitally controlled oscillator based on the phase error signal, wherein:

generating the feedback clock signal comprises:

connecting a first current source to a capacitor according to a fixed delay with respect to the divided clock signal;

connecting a second current source to the capacitor prior to the fixed delay according to a first programmable select parameter;

connecting a third current source to the capacitor prior to the fixed delay according to a second programmable select parameter; and generating the feedback clock signal based on a voltage of the capacitor after connecting the first current source, the second current source, and the third current source to the capacitor.

2. The method of claim 1, comprising:

providing the divided clock signal to a set of serial flip flops clocked by a first clock signal; and generating a first timing signal for connecting the first current source to the capacitor at an output of a last flip flop in the set of serial flip flops.

3. The method of claim 2, comprising:

suppressing the first clock signal after generating the first timing signal.

4. The method of claim 2, comprising:

generating a second timing signal for connecting the second current source to the capacitor at an output of a first selected one of the flip flops in the set of serial flip flops based on the first programmable select parameter; and generating a third timing signal for connecting the third current source to the capacitor at an output of a second selected one of the flip flops in the set of serial flip flops based on the second programmable select parameter.

5. The method of claim 4, comprising:

configuring a first multiplexer connected to each of the flip flops in the set of serial flip flops based on the first programmable select parameter to connect to the first selected one of the flip flops to generate the second timing signal; and configuring a second multiplexer connected to each of the flip flops in the set of serial flip flops based on the second programmable select parameter to connect to the second selected one of the flip flops to generate the third timing signal.

6. The method of claim 2, comprising:

configuring a first multiplexer connected to each of the flip flops in the set of serial flip flops based on the first programmable select parameter to connect to a first selected one of the flip flops to generate an intermediate timing signal;

connecting the first multiplexer to a first flip flop clocked by a rising edge of the output clock signal;

connecting the first flip flop to a second flip flop clocked by a falling edge of the output clock signal; and selecting an output of one of the first flip flop or the second flip flop to generate a second timing signal for connecting the second current source to the capacitor.

7. The method of claim 1, comprising:

discharging the capacitor after generating the feedback clock signal.

8. A frequency synthesizer, comprising:

a digitally controlled oscillator configured to generate an output clock signal based on a digital control word;

a clock divider configured to divide the output clock signal to generate a divided clock signal;

a digital-to-time converter configured to generate a feedback clock signal based on the divided clock signal;

a time-to-digital converter configured to generate a phase error signal based on a bias control word and a phase difference between a reference clock signal and the feedback clock signal; and a loop filter configured to generate the digital control word based on the phase error signal, wherein:

the digital-to-time converter comprises:

a delay circuit, comprising:

a capacitor;

a first current source;

a second current source;

a third current source; and a buffer configured to generate the feedback clock signal based on a voltage of the capacitor; and a precharge generator configured to:

generate a first timing signal for connecting the first current source to the capacitor according to a fixed delay with respect to the divided clock signal;

generate a second timing signal for connecting the second current source to the capacitor according to a first programmable select parameter; and generate a third timing signal for connecting the third current source to the capacitor according to a second programmable select parameter.

9. The frequency synthesizer of claim 8, wherein:

the precharge generator comprises a set of serial flip flops connected to the divided clock signal and clocked by a first clock signal, and the first timing signal is generated at an output of a last flip flop in the set of serial flip flops.

10. The frequency synthesizer of claim 9, wherein:

the digital-to-time converter comprises:

a power management unit configured to suppress the first clock signal after the first timing signal is generated.

11. The frequency synthesizer of claim 9, wherein:

the precharge generator comprises:

a first multiplexer connected to each of the flip flops in the set of serial flip flops and configured based on the first programmable select parameter to connect to a first selected one of the flip flops to generate the second timing signal; and a second multiplexer connected to each of the flip flops in the set of serial flip flops and configured based on the second programmable select parameter to connect to a second selected one of the flip flops to generate the second timing signal.

12. The frequency synthesizer of claim 9, wherein:

the precharge generator comprises:

a first multiplexer connected to each of the flip flops in the set of serial flip flops and configured based on the first programmable select parameter to connect to a first selected one of the flip flops to generate an intermediate timing signal;

a first flip flop connected to the first multiplexer and clocked by a rising edge of the output clock signal;

a second flip flop connected to the first flip flop and clocked by a falling edge of the output clock signal; and a second multiplexer connected to the first flip flop and the second flip flop and configured to select an output of one of the first flip flop or the second flip flop to generate the second timing signal for connecting the second current source to the capacitor.

13. The frequency synthesizer of claim 8, wherein:

the digital-to-time converter comprises:

a switch selectively connecting the capacitor to ground; and a reset circuit configured to generate a reset signal for controlling the switch to discharge the capacitor after generating the feedback clock signal.

14. The frequency synthesizer of claim 8, wherein:
the first current source has a first size;
the second current source has the first size; and
the third current source has a second size different than the first size.

15. A radio, comprising:
an antenna port;
a transmit-receive switch connected to the antenna port;
a receive path connected to the transmit-receive switch;
a transmit path connected to the transmit-receive switch; and
a processor configured to connect the receive path to the transmit-receive switch in a receive mode of the radio and connect the transmit path to the transmit-receive switch in a transmit mode of the radio, wherein:
the transmit path comprises:
a frequency synthesizer configured to generate an output clock signal;
a local oscillator generator configured to generate a local oscillator signal based on the output clock signal; and
a power amplifier connected to the transmit-receive switch and configured to amplify the local oscillator signal to generate a transmit signal;
the frequency synthesizer comprises:
a digitally controlled oscillator configured to generate the output clock signal based on a digital control word;
a clock divider configured to divide the output clock signal to generate a divided clock signal;
a digital-to-time converter configured to generate a feedback clock signal based on the divided clock signal;
a time-to-digital converter configured to generate a phase error signal based on a bias control word and a phase difference between a reference clock signal and the feedback clock signal; and
a loop filter connected to the time-to-digital converter and configured to generate the digital control word based on the phase error signal, wherein:
the digital-to-time converter comprises:
a delay circuit, comprising:
a capacitor;
a first current source;
a second current source;
a third current source; and
a buffer configured to generate the feedback clock signal based on a voltage of the capacitor; and
a precharge generator configured to:
generate a first timing signal for connecting the first current source to the capacitor according to a fixed delay with respect to the divided clock signal;
generate a second timing signal for connecting the second current source to the capacitor according to a first programmable select parameter; and
generate a third timing signal for connecting the third current source to the capacitor according to a second programmable select parameter.

16. The radio of claim 15, wherein:
the precharge generator comprises:
a set of serial flip flops connected to the divided clock signal and clocked by a first clock signal;
a first multiplexer connected to each of the flip flops in the set of serial flip flops and configured based on the first programmable select parameter to connect to a first selected one of the flip flops to generate the second timing signal; and
a second multiplexer connected to each of the flip flops in the set of serial flip flops and configured based on the second programmable select parameter to connect to a second selected one of the flip flops to generate the second timing signal.

17. The radio of claim 16, wherein:
the digital-to-time converter comprises:
a power management unit configured to suppress the first clock signal after the first timing signal is generated.

18. The radio of claim 16, wherein:
the first timing signal for connecting the first current source to the capacitor is generated at an output of a last flip flop in the set of serial flip flops.

19. The radio of claim 15, wherein:
the digital-to-time converter comprises:
a switch selectively connecting the capacitor to ground; and
a reset circuit configured to generate a reset signal for controlling the switch to discharge the capacitor after generating the feedback clock signal.

20. The radio of claim 15, wherein:
the first current source has a first size;
the second current source has the first size; and
the third current source has a second size different than the first size.

* * * * *